United States Patent
Huijsing et al.

(10) Patent No.: US 10,033,369 B2
(45) Date of Patent: Jul. 24, 2018

(54) FULLY CAPACITIVE COUPLED INPUT CHOPPERS

(71) Applicant: Maxim Integrated Products, Inc., San Jose, CA (US)

(72) Inventors: Johan Hendrik Huijsing, Schipluiden (NL); Qinwen Fan, Delft (NL); Kofi Afolabi Anthony Makinwa, Delft (NL)

(73) Assignee: Maxim Integrated Prodcuts, Inc., San Jose, CA (US)

( * ) Notice: Subject to any disclaimer, the term of this patent is extended or adjusted under 35 U.S.C. 154(b) by 0 days.

(21) Appl. No.: 14/860,423

(22) Filed: Sep. 21, 2015

(65) Prior Publication Data
US 2016/0013787 A1    Jan. 14, 2016

Related U.S. Application Data

(62) Division of application No. 13/325,847, filed on Dec. 14, 2011, now Pat. No. 9,143,092.

(51) Int. Cl.
*H03K 17/081* (2006.01)
*H03F 1/52* (2006.01)
(Continued)

(52) U.S. Cl.
CPC ....... *H03K 17/08104* (2013.01); *H03F 1/523* (2013.01); *H03F 3/393* (2013.01);
(Continued)

(58) Field of Classification Search
CPC ... H03K 17/08104; H03F 1/523; H03F 3/393; H03F 3/45179; H03M 3/34
See application file for complete search history.

(56) References Cited

U.S. PATENT DOCUMENTS

| 3,550,013 A | 12/1970 | Gurol |
| 6,201,835 B1 | 3/2001 | Wang |

(Continued)

FOREIGN PATENT DOCUMENTS

| CN | 1960169 | 5/2007 |
| CN | 101197559 | 6/2008 |

(Continued)

OTHER PUBLICATIONS

"Office Action dated Dec. 5, 2016; Chinese Patent Application No. 201210539511.1", (dated Dec. 5, 2016).
(Continued)

*Primary Examiner* — Lincoln Donovan
*Assistant Examiner* — Colleen O Toole
(74) *Attorney, Agent, or Firm* — Womble Bond Dickinson (US) LLP

(57) ABSTRACT

A method of differential signal transfer from a differential input Vinp and Vinn having a common mode input voltage that can be higher than the power supply voltage by providing an input chopper having first through fourth chopper transistors, each having a source, a drain and a gate, the input chopper having Vinp and Vinn as a differential input, providing an output chopper, capacitively coupling a differential output Voutp and Voutn of the input chopper to a differential input of the output chopper, capacitively coupling a clock to the input chopper and coupling the clock to the output chopper, the clock having a first phase and a second phase opposite from the first phase, the first phase being coupled to the gates of the first and second transistors and the second phase being coupled to the gates of the third and fourth transistors, and providing protection of the gates of the first through fourth transistors from excessive voltages. Various embodiments are disclosed.

3 Claims, 10 Drawing Sheets

(51) Int. Cl.
  *H03F 3/393* (2006.01)
  *H03F 3/45* (2006.01)
  *H03M 3/00* (2006.01)

(52) U.S. Cl.
  CPC .......... *H03F 3/45179* (2013.01); *H03M 3/34* (2013.01); *H03F 2200/261* (2013.01); *H03M 3/43* (2013.01); *H03M 3/452* (2013.01)

(56) References Cited

U.S. PATENT DOCUMENTS

| | | |
|---|---|---|
| 6,456,159 B1 | 9/2002 | Brewer |
| 6,559,720 B1 | 5/2003 | Huijsing et al. |
| 6,734,723 B2 | 5/2004 | Huijsing et al. |
| 7,132,883 B2 | 11/2006 | Huijsing et al. |
| 7,202,738 B1 | 4/2007 | Huijsing et al. |
| 7,209,000 B2 | 4/2007 | Huijsing et al. |
| 7,262,654 B2 | 8/2007 | Kejariwal et al. |
| 7,304,598 B1 | 12/2007 | Bogner et al. |
| 7,385,443 B1 | 6/2008 | Denison |
| 7,535,295 B1 | 5/2009 | Huijsing et al. |
| 7,696,817 B1 | 4/2010 | Boucher et al. |
| 7,714,757 B2 | 5/2010 | Denison et al. |
| 7,847,628 B2 | 12/2010 | Denison |
| 7,999,710 B2 | 8/2011 | Matthews et al. |
| 8,120,422 B1 | 2/2012 | Huijsing et al. |
| 8,179,195 B1 | 5/2012 | Huijsing et al. |
| 8,213,142 B2 * | 7/2012 | Worley ............... H01L 27/0255 361/118 |
| 8,354,881 B2 | 1/2013 | Denison |
| 2001/0022525 A1 | 9/2001 | Grimaldi et al. |
| 2007/0096807 A1 | 5/2007 | Aram et al. |
| 2008/0018392 A1 | 1/2008 | Nolan et al. |
| 2012/0068766 A1 | 3/2012 | Buter et al. |

FOREIGN PATENT DOCUMENTS

| | | |
|---|---|---|
| CN | 101449459 | 6/2009 |
| CN | 102195652 | 9/2011 |

OTHER PUBLICATIONS

"Office Action dated May 8, 2015; U.S. Appl. No. 14/180,639", (dated May 8, 2015).

"U.S. Appl. No. 14/180,639, filed Feb. 14, 2014", (Feb. 14, 2014).

Fan, Qinwen, et al., "A 1.8 μW 60 nV/√Hz Capacitively-Coupled Chopper Instrumentation Amplifier in 65 nm CMOS for Wireless Sensor Nodes", *IEEE Journal of Solid-State Circuits*, vol. 46, No. 7, (Jul. 2011), pp. 1534-1543.

Fan, Qinwen, et al., "A Capacitively Coupled Chopper Instrumentation Amplifier with a ±30V Common-Mode Range, 160 dB CMRR and 5μV Offset", *2012 IEEE International Solid-State Circuits Conference*, Session 21, Analog Techniques, (Feb. 22, 2012), pp. 374-376.

Huijsing, Johan, "Operational Amplifiers, Theory and Design, Second Edition", Chapters 6.2, 10.5, 10.7, 10.8 and 10.10, Springer Science+Business Media B.V., (2011), pp. 162-197, 358-361, 366-376, 382-389.

Rothan, Frederic, et al., "A ±1.5% Nonlinearity 0.1-to-100A Shunt Current Sensor Based on a 6kV Isolated Micro-Transformer for Electrical Vehicles and Home Automation", *2011 IEEE International Solid-State Circuits Conference (ISSCC)*, Session 6, Sensors & Energy Harvesting, 6.5, (Feb. 21, 2011), 3 pp total.

Wu, Rong, et al., "A Chopper Current-Feedback Instrumentation Amplifier With a 1 mHz 1/*f* Noise Corner and an AC-Coupled Ripple Reduction Loop", *IEEE Journal of Solid-State Circuits*, vol. 44, No. 12, (Dec. 2009), pp. 3232-3243.

"Office Action dated May 17, 2017; Chinese Patent Application No. 201210539511.1", (dated May 17, 2017).

"Notice of Allowance dated Sep. 7, 2017; Chinese Patent Application No. 201210539511.1", dated Sep. 7, 2017.

"Office Action dated Sep. 11, 2017; Chinese Patent Application No. 201310122194.8", dated Sep. 11, 2017.

\* cited by examiner

FULLY CAPACITIVE COUPLED INPUT CHOPPERS

CROSS-REFERENCE TO RELATED APPLICATIONS

This application is a divisional of U.S. patent application Ser. No. 13/325,847 filed Dec. 14, 2011.

BACKGROUND OF THE INVENTION

1. Field of the Invention

The present invention relates to the field of input choppers for such uses as in operational amplifiers, instrumentation amplifiers and analog-to-digital converters.

2. Prior Art

Instrumentation amplifiers and analog-to-digital converters are frequently used for sensor interfacing. In current-sense applications for power management of cell phones, laptops, and electric cars, a small differential-mode voltage in the order of millivolts has to be measured across a current-sense resistor in the presence of a large common-mode voltage on the sense resistor on the order of Volts or tens of Volts higher than the supply voltage. To solve this differential-mode voltage measurement problem while the common-mode voltage is beyond the supply-rail, often a part of the input circuitry (which may be a resistor bridge or a voltage-to-current converter) is allowed to draw its common-mode supply current from the sense resistor. This input common-mode supply current often has an undesired influence on the system to be measured. Therefore, instrumentation amplifiers and analog-to-digital converters with capacitive-coupled input choppers have been developed that do not draw input common-mode supply current, while being able to sense beyond their supply-rail voltage. One such prior art technique is to use an input chopper followed by a capacitive coupled differential input. A second chopper rectifies the square wave back into the input waveform.

Another prior art technique is to use transformers, as shown in U.S. Pat. No. 7,714,757. That solution is expensive to implement, both in cost and in circuit board area, as it cannot easily be fully integrated.

DETAILED DESCRIPTION OF THE PREFERRED EMBODIMENTS

Figure 1:
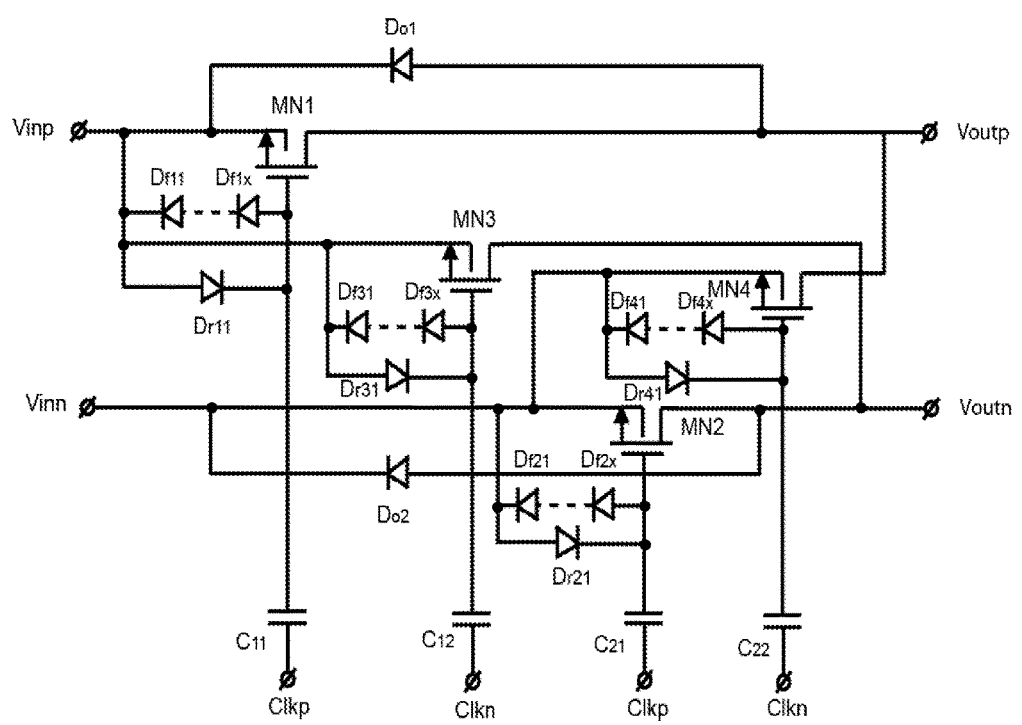
FIG. 1 illustrates a capacitive coupled chopper with diode-protected gates and active pull down protection.

FIG. 1 illustrates a first approach to a capacitive coupled chopper. As shown therein, four clock-driver capacitors C11 through C22 are provided, one capacitor for each chopper transistor MN1 through MN4. Each transistor gate has a reverse diode Dr for protection against too large a negative gate voltage and a forward series chain of diodes Dfx to protect against too large a positive drain source voltage. These excessive voltages could originate from large common-mode input voltage movements. The peak-to-peak clock voltage Clkp,Clkn must be less than the sum of the reverse and forward diode voltages. Otherwise large charge injection on the input terminals Vinp,Vinn occurs. Furthermore, there are diodes Do1 and Do2 from the output to the input to protect the transistors MN1-MN4 against too large a drain source voltage in case the clock is not present to connect input and output Vinp, Voutp, and Vinn and Voutn, and the common-mode output voltage would not follow a large negative common-mode input step. The back gate-to-channel diodes (referred to in the claims as a body diode between the drain and body of each transistor) automatically perform this function for a positive common-mode input step under the same conditions. The peak-to-peak differential-mode input voltage must be smaller than that of two forward biased diode voltage drops. For larger differential-mode input voltages, other chopper circuits may be used.

A disadvantage of the capacitive coupled chopper with the diode-protected gates of FIG. 1 is that the peak-to-peak clock voltages must be larger than the sum of the protection diodes (diodes Dr) voltages and the chopper transistor threshold voltage Vth in order to reliably turn on the chopper switches. It would be better for a low charge injection that the peak-to-peak clock voltage just needs to be larger than the threshold voltage Vth of the chopper transistors. To this end the reverse gate voltage protection diodes Dr11 through Dr41 and forward series chain of diodes Df11 through Df4x are replaced by latches (transistors MN5 and MN6, and MN7 and M8) as shown in FIG. 2.

Figure 3:
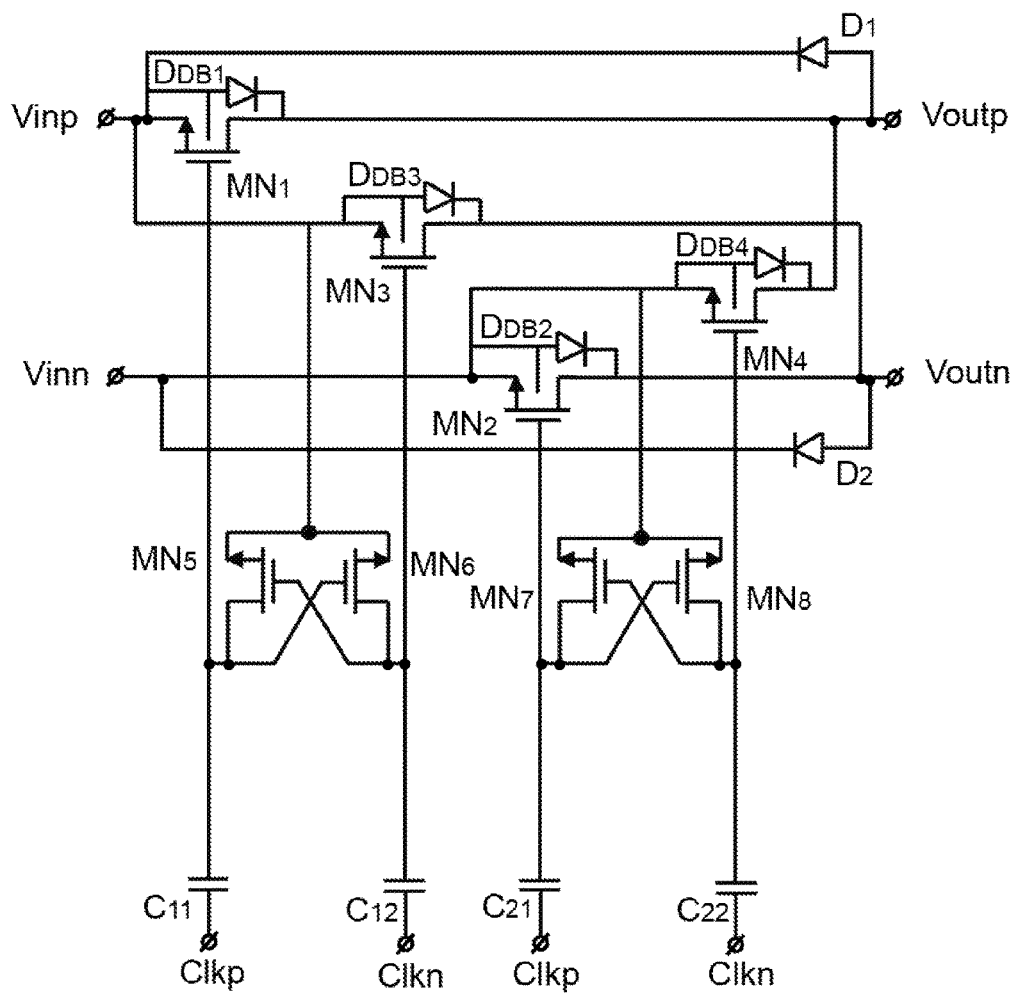
FIG. 3 presents a circuit that uses one latch for controlling the gates of transistors MN1 and MN3, and a second latch for controlling the gates of transistors MN2 and MN4.

Now referring to FIG. 3, each latch has a common connection connecting the sources of transistors MN5 and MN6, and MN7 and MN8, respectively to the inputs Vinp and Vinn, respectively. These latches accurately define the start position of the gate voltages of transistors MN1-MN4 for a next clock inversion. For instance, if the chopper switch MN1 is on, latch transistor MN6 is also on, which switches chopper transistor MN3 accurately off by connecting its gate to its source. Thus each latch has first and second latch connections of opposite states, as well as a common connection of transistor sources to the inputs Vinp and Vinn.

Figure 2:
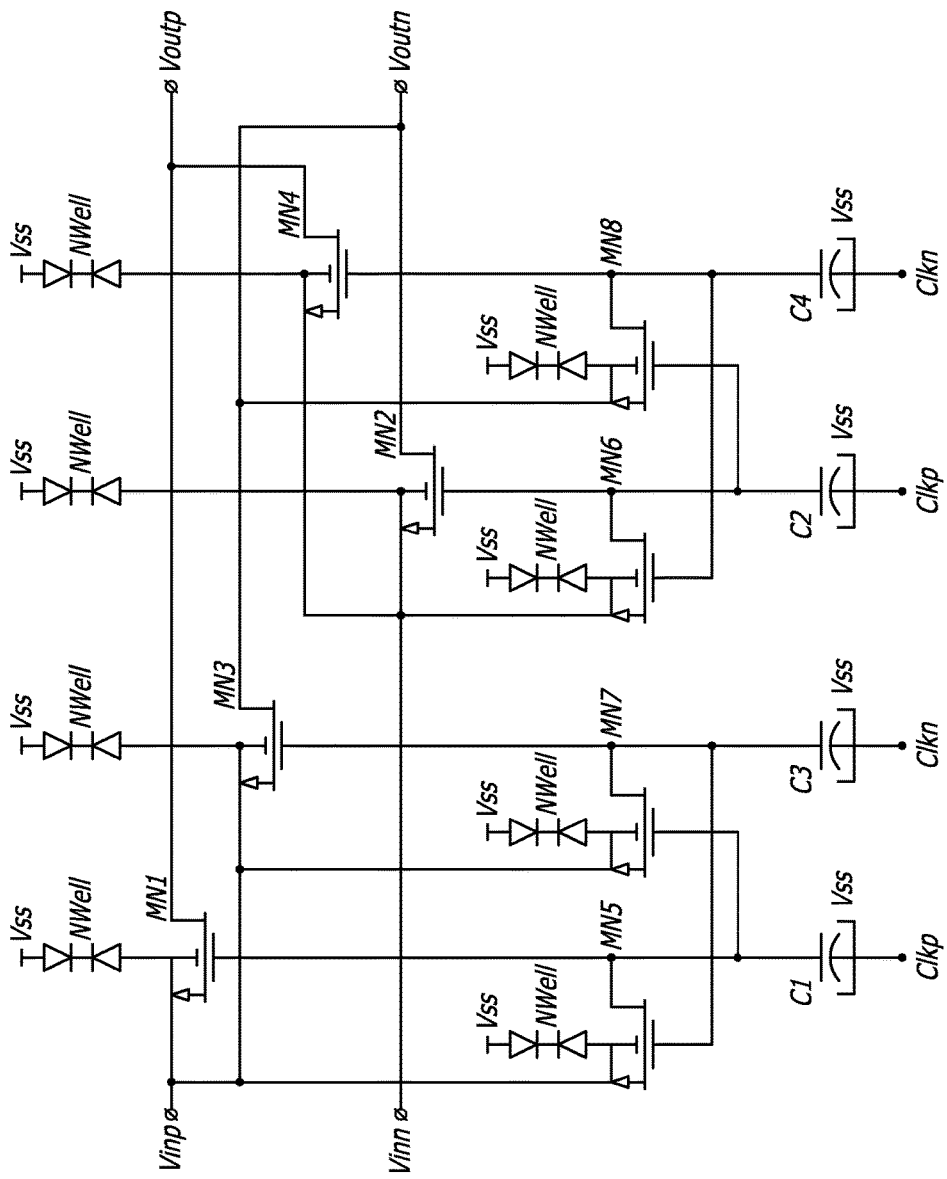
FIG. 2 illustrates a capacitive coupled chopper with floating wells for large plus and minus common mode input voltage capability with latch-protected gates.

Now referring to FIG. 2, another embodiment of the present invention may be seen. This embodiment may have a differential input voltage with a high common mode voltage, way higher (or lower) than the power supply voltage, such as on the order of ±30 volts. In this embodiment, the four chopper transistors MN1-MN4 are each in a respective floating n-well, symbolically represented by the back-to-back diodes coupled between Vss and the body of the respective chopper transistor. Also as before, the gates of the chopper transistors MN1-MN4 are capacitively coupled to the clock signals Clkp and Clkn. Four additional transistors are also provided, namely transistors MN5-MN8, connected to the gates of the transistors MN1-MN4, respectively, as latches. Transistors MN5-MN8 are each also in respective floating n-wells. In that regard, the other embodiments disclosed herein all use floating wells in a similar manner, though the back-to-back diodes are not shown in the other Figs. to avoid unnecessary clutter and not obscure the details of the circuits disclosed.

Considering first transistors MN1 and MN5, when Clkn goes high and Clkp is low, transistor MN5 will turn on to the extent required to bring its drain equal to its source voltage, namely, the input voltage Vinp. With the drain of transistor MN5 at the voltage Vinp, transistor MN1 will still be off, as its gate voltage will be equal to its source voltage, while chopper transistor MN3 turns on. Then when Clkn goes low, transistor MN5 is turned off and of course Clkp goes high, turning on transistor MN1, and turning transistor MN3 off. Thus transistor MN5 determines or sets the voltage on the gates of transistor MN1 and MN7 when Clkn is high based in the input Vinp, which gate connections are otherwise effectively floating. Transistor MN7 functions similarly for transistor M3, as does transistor MN6 for transistor MN2 and transistor MN8 for transistor MN4.

Note also from FIG. 2 that in the event of a negative surge on the common mode voltage for the inputs INP and INN, the sources of transistors MN5-MN8 will be pulled low to turn on these transistors by the charges on capacitors C1-C4, with the capacitors C1-C4 being discharged as the common source connection voltage surges down. In this FIG., no protection is shown for excessive drain source voltages, though one or more series connected diodes may be coupled from drain to source for transistors MN1 and MN2 with a polarity opposite the polarity of the respective body-drain.

Figure 4:
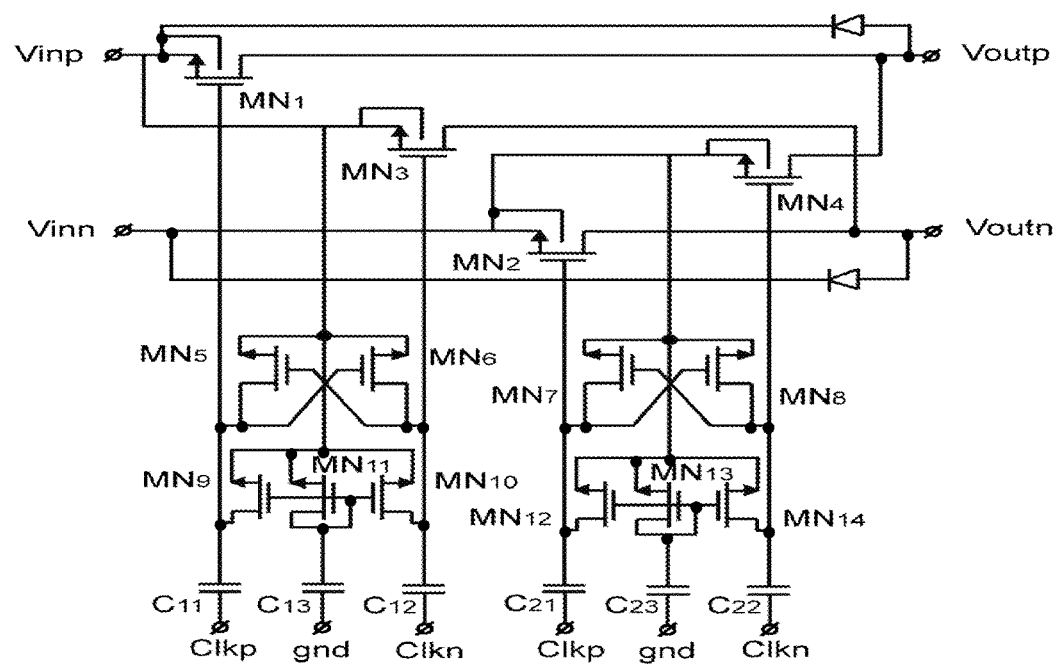
FIG. 4 illustrates a capacitive coupled chopper with latch-protected gates and active pull down protection.

Now referring to FIG. 4, some protection measures have to be taken. In the case that the clock is turned off, the chopper gate voltages may not be defined and the chopper transistors MN1-MN4 may be destroyed. In that case the back gate or body diodes (the body of each transistor being connected to its source) of the latch transistors protect the chopper gate voltages at a positive input common-mode voltage surge. But for a negative input common-mode voltage surge, the chopper gate voltages may stay high and be destroyed. This is particularly the case when the clock is off and the latches are not functioning. To protect the choppers in this situation, a model of the clock coupling capacitors is provided by capacitors C13 and C23. Upon the occurrence of a negative input common-mode voltage surge, the charge of these model capacitors is mirrored back in the clock coupling capacitors by the transistors MN9,10,11 and MN12,13,14, respectively. In particular, a negative input voltage surge on the input Vinp will pull the common source connection of transistor MN11 below the voltage on coupling capacitor C13, turning on diode connected transistor MN11 to discharge capacitor C13 accordingly. The current in transistor MN11 is mirrored to transistors MN9 and MN10, turning them on also to similarly discharge capacitors C11,12, respectively. Transistors MN12-MN14 operate in the same manner, responding to the voltage drop on the input Vinn. In essence, when a negative common-mode voltage surge is encountered, the gates of transistors MN1 and MN3 are coupled to the input Vinp and the gates of transistors MN2 and MN4 are coupled to the input Vinn. This makes the gate voltages track the negative input common-mode surge so that the chopper transistors are not destroyed. Furthermore, the same diodes as in FIG. 1 from the output to the input have to be inserted to protect the chopper transistors MN1-MN4 against large negative common-mode input voltage steps in the case that the clock is not present.

Figure 5:
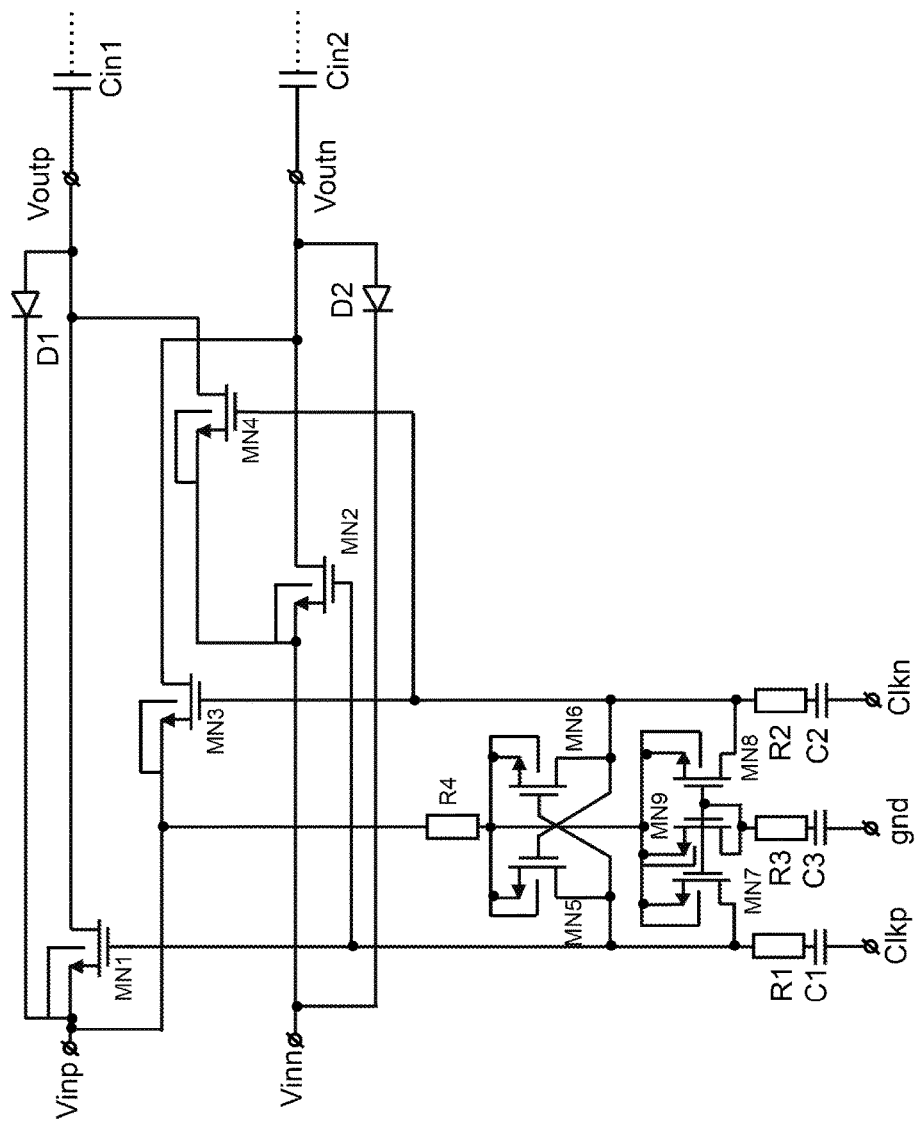
FIG. 5 is similar to FIG. 4, though the body of each of transistors MN1-MN4 is coupled to the source of the respective transistor, and the second latch (on the inputs Vinp and Vinn) has been eliminated.

FIG. 5 is similar to FIG. 4, though the body of each of transistors MN1-MN4 is coupled to the source of the respective transistor, and the second latch (on the input Vinn) have been eliminated. Note that the common connection of the latch is connected to the input Vinp, though alternatively could be connected to the input Vinn, as the differential inputs will normally not be large, and Vinp is not necessarily always a higher voltage than Vinn.

Figure 6:
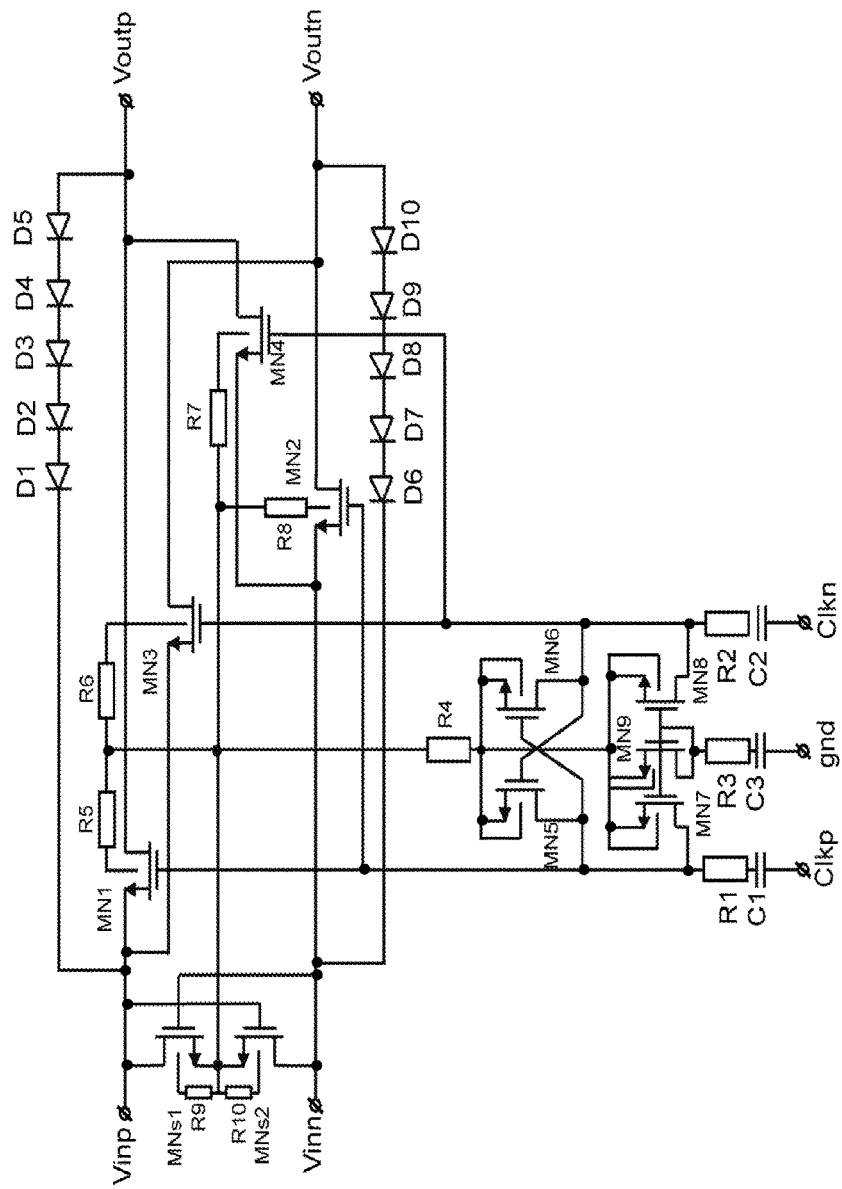
FIG. 6 illustrates a capacitive coupled chopper with series latches for protection while allowing larger differential-mode input voltages and active pull down protection.

An improvement of the circuit of FIG. 5 can be made if one connects a second latch MNs1 and MNs2 in series with a first latch MN5 and MN6, as shown in FIG. 6. The first latch formed by transistors MN5 and MN6 accurately defines the start position of the gate voltages of transistors MN1-MN4 for a next clock inversion. The second latch automatically connects the common source connection of the first latch with the input terminal Vinp or Vinn that carries the lowest voltage. Now on the occurrence of a negative common-mode voltage surge, transistors MN7-MN9 will effectively couple the gates of transistors MN1-MN4 to the lower of the inputs Vinp and Vinn. Also by this connection, the four chopper transistors MN1-MN4 can share one set of clock coupling capacitors. The back gates of the chopper transistors are now connected to the input terminal with the lowest voltage. All together this topology allows the differential-mode input voltage to be larger than one diode forward voltage drop. This may be useful for instrumentation amplifiers by allowing larger differential-mode input voltages. For allowing larger differential-mode input voltages, the output-input protection diodes for large negative common-mode input voltage steps now have to be replaced by a diode series chain. The series resistances R3-R6 on the clock coupling capacitors and common source points and back gates are inserted to isolate sharp clock edges of the clock lines from the signal lines.

Figure 7:
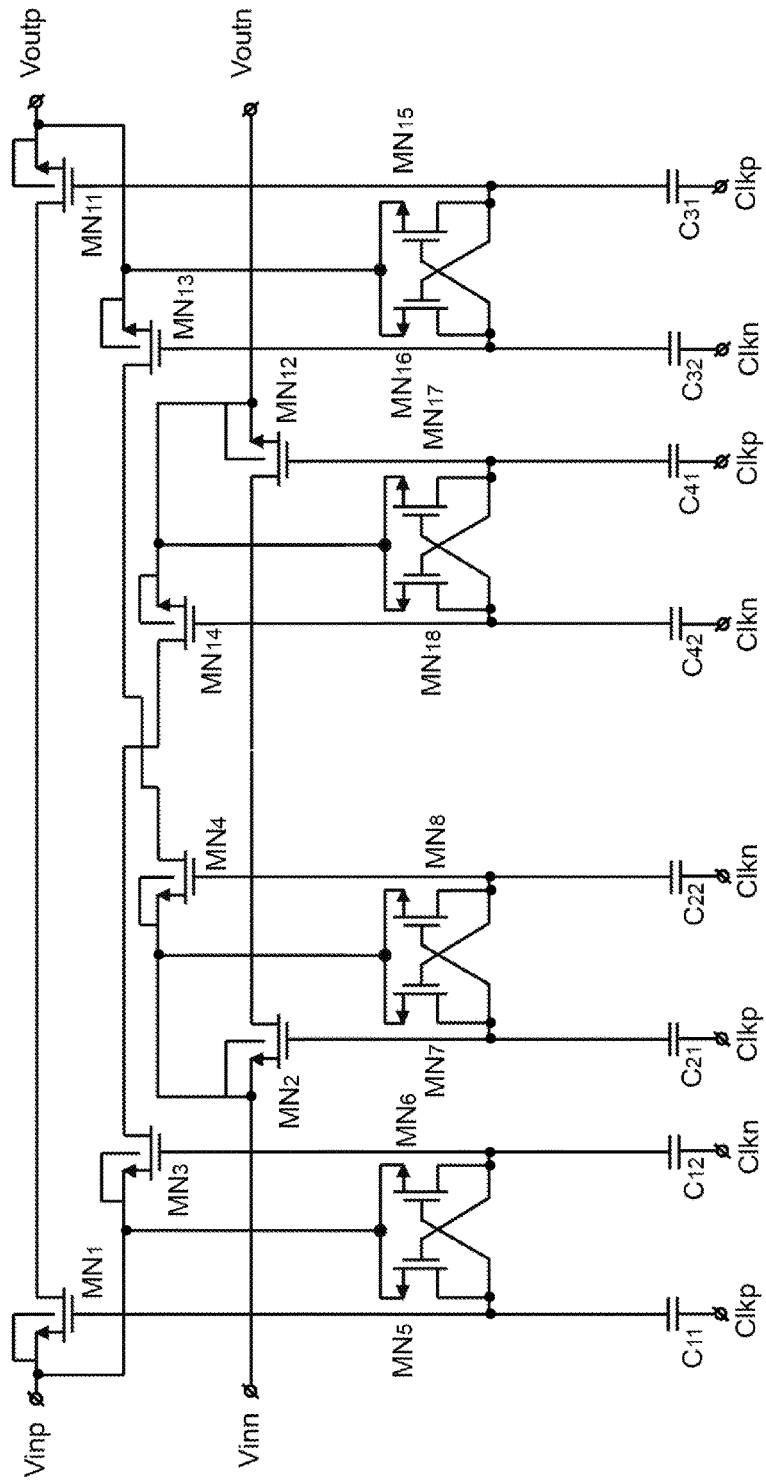
FIG. 7 illustrates two anti-series capacitive coupled choppers, also with floating wells, having both a large plus and minus common mode input voltage capability and additionally a large differential input voltage capability.

Now referring to FIG. 7, an embodiment having both a high plus and minus common mode capability, together with a high differential input capability, may be seen. In this embodiment, all transistors are in floating wells, though the characteristic to-back diodes showing the same in FIG. 4 having not been shown in FIG. 7 for purposes of clarity. In FIG. 7, transistors MN1-MN4, capacitors C11-C22 and transistors MN5-MN8 function the same as that described with respect to transistors MN1-MN4, transistors MN5-MN8 and capacitors C1-C4 in FIG. 2, as described above. Transistors M11-M14, capacitors C31-C42 and transistors M15-M18 operate in the same manner, with transistor MN11 being turned on and off in unison with transistor MN1, transistor M12 being turned on and off in unison with transistor MN2, transistor M13 being turned on and off in unison with transistor MN3 and transistor M14 being turned on and off in unison with transistor MN4. Thus transistors MN1-MN4 are protected from excessive drain source voltages by isolating the same from the outputs OUTP and OUTN and by the opposed body diodes of transistors MN1 and MN11, MN2 and MN12, MN3 and MN13, and MN4 and MN14.

Figure 8:
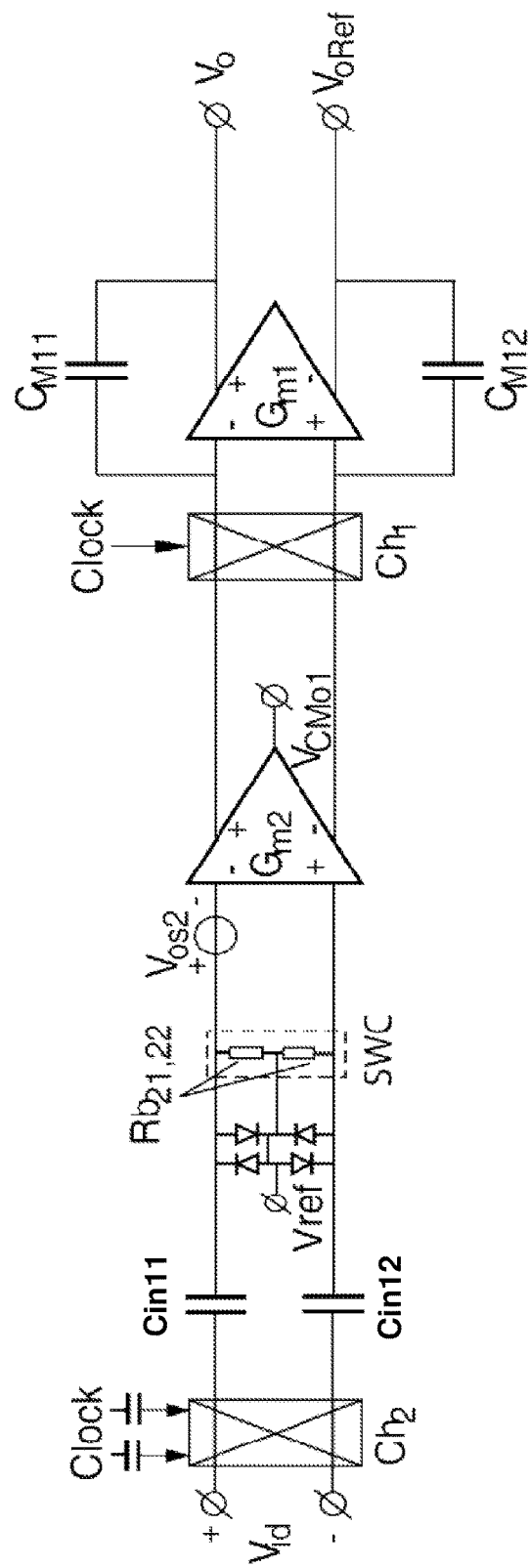
FIG. 8 illustrates an exemplary capacitive coupled operational amplifier.
Figure 9:
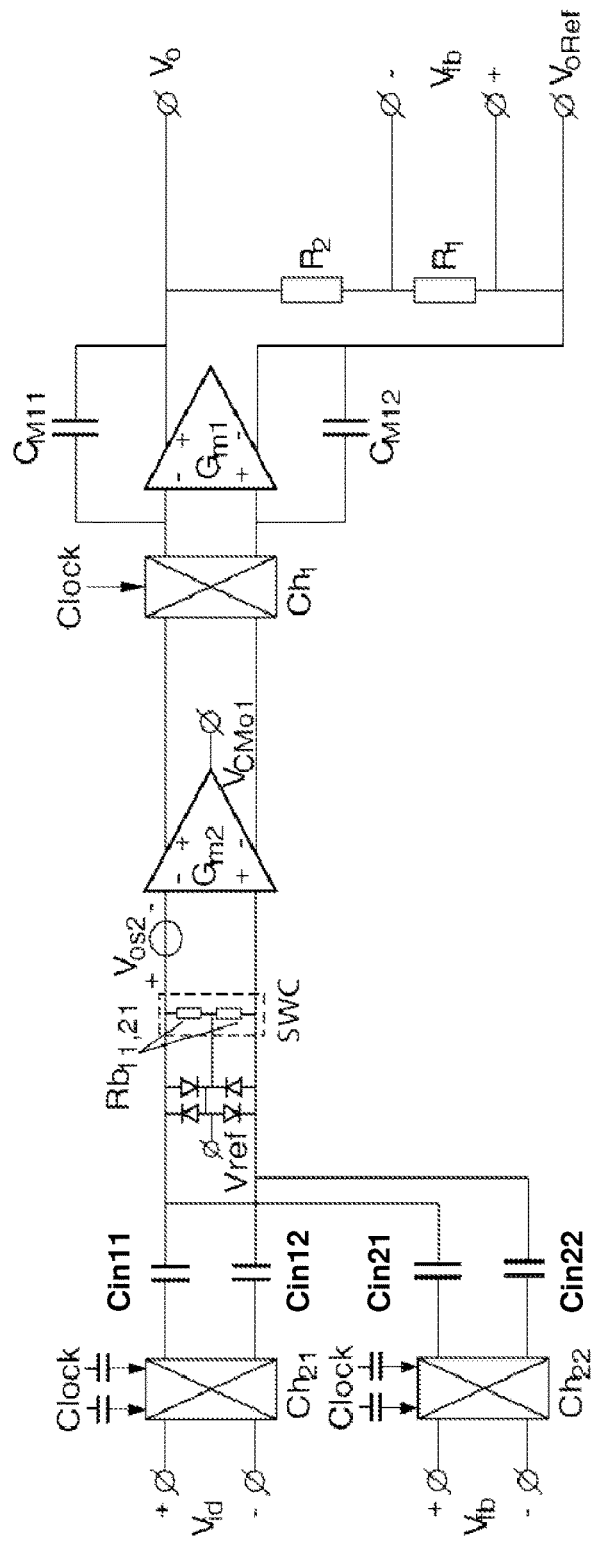
FIG. 9 illustrates an exemplary capacitive coupled instrumentation amplifier.
Figure 10:
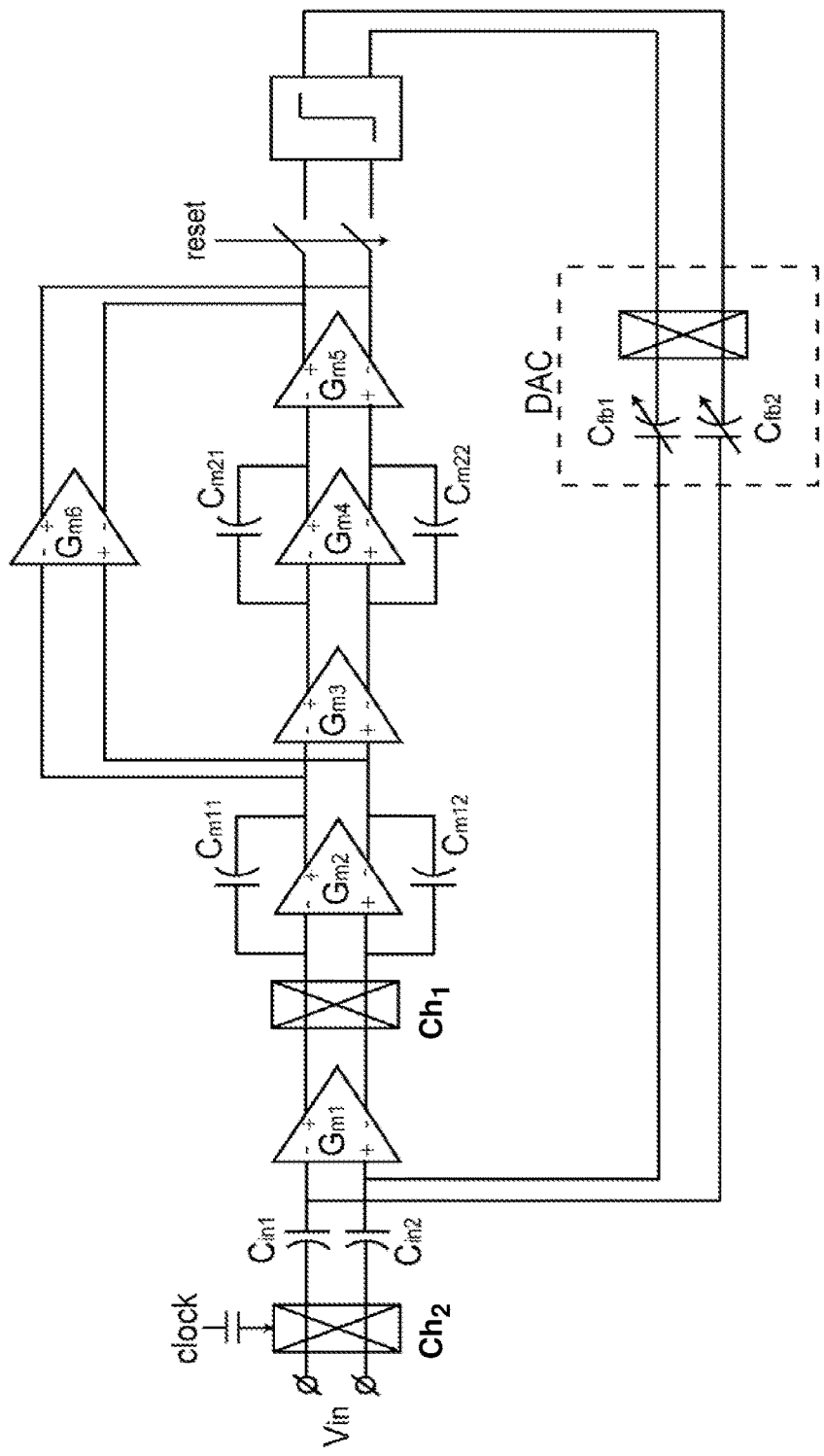
FIG. 10 illustrates an exemplary capacitive coupled sigma delta analog-to-digital converter.

The capacitive coupled input choppers can be used in operational amplifiers, instrumentation amplifiers, and analog-to-digital converters, as exemplified in FIGS. 8, 9, and 10, respectively. In FIGS. 8 and 10, the chopper $Ch_2$ would be in accordance with the present invention, and in FIG. 9, the chopper $Ch_{21}$ would be in accordance with the present invention. Note that the input choppers $Ch_2$ and $Ch_{21}$ are coupled to an output chopper (Ch₁ in FIGS. 8, 9 and 10), though not necessarily directly connected thereto, and in fact usually would have intervening circuitry between the two choppers, such as at least one amplifier as shown in these Figs. In general, these circuits and multiple variations thereof are well known in the prior art and therefore are not further described herein, as these circuits speak for themselves to one of ordinary skill in the art.

Thus the floating input choppers consist of four transistors MN1-4. These transistors are placed in isolated pockets. Their gates are coupled to the clock signals by series capacitors. In the embodiment of FIG. 6, the lowest of the two gate voltages is fixed at the lowest voltage of the two input connectors by latch MN5,MN6 in series with input latch MNs1,MNs2. The other gate voltage is one clock voltage higher. By this the chopper transistors are robustly switched on and off. All other elements are for protection against high and low voltage surges at the input. The output capacitors couple the chopper output to the Amplifier or analog-to-digital converter. A feature of the invention is that the input chopper floats with the common-mode input voltage. This allows a large positive and in some embodiments, age negative common-mode input swing, only restricted by pocket and capacitor breakdown voltages of the process. Common-mode input current is blocked by the small coupling capacitors and parasitic capacitors. The resulting input offset is low, in micro-volts, because of chopping.

Thus the present invention has a number of aspects, which aspects may be practiced alone or in various combinations or sub-combinations, as desired. While a preferred embodiment of the present invention has been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A method of differential signal transfer from a differential input Vinp and Vinn having a common mode input voltage that can be higher than the power supply voltage, comprising:

providing an input chopper having first through fourth chopper transistors, each having a source, a drain and a gate, the input chopper having Vinp and Vinn as a differential input;

providing an output chopper;

capacitively coupling a differential output Voutp and Voutn of the input chopper to a differential input of the output chopper;

capacitively coupling a clock to the input chopper and coupling the clock to the output chopper, the clock having a first phase and a second phase opposite from the first phase, the first phase being capacitively coupled to the gates of the first and second transistors and the second phase being capacitively coupled to the gates of the third and fourth transistors; and, providing protection of the gates of the first through fourth transistors from being destroyed by excessive voltages when a negative common mode voltage surge occurs on the inputs Vinp and Vinn, by coupling the gates of the first and third transistors to the input Vinp, and coupling the gates of the second and fourth transistors to the input Vinn;

providing protection for the first through fourth transistors against being destroyed by a negative common mode input voltage step;

wherein the first through fourth transistors are MOS transistors, and wherein the sources of the first and third transistors are coupled to the Vinp input, the sources of the second and fourth transistors are coupled to the Vinn input, the drains of the first and fourth transistors are coupled to input chopper output Voutp and the drains of the second and third transistors being coupled to the input chopper output Voutn.

2. The method of claim 1 wherein the coupling the gates of the first and third transistors to the input Vinp comprises capacitively coupling a diode connected fifth transistor between ground and the input Vinp, and coupling first replica transistors to the gates of the first and third transistors, the first replica transistors replicating a conduction state of the diode connected fifth transistor to turn on the first replica transistors when a negative surge on the input Vinp reverses the voltage across the diode connected fifth transistor, and wherein the coupling the gates of the second and fourth transistors to the input Vinn comprises capacitively coupling a diode connected sixth transistor between ground and the input Vinn, and coupling second replica transistors to the gates of the second and fourth transistors, the second replica transistors replicating a conduction state of the diode connected sixth transistor to turn on when a negative surge on the input Vinn reverses the voltage across the diode connected sixth transistor.

3. The method of claim 2 further comprising providing protection of the first through fourth transistors from excessive drain source voltages by coupling a diode or a series connection of multiple diodes between the drain and source of each of the first and second transistors, the diodes having a polarity opposite the polarity of the respective body diodes of the first and second transistors.

\* \* \* \* \*